United States Patent
Schmid et al.

(10) Patent No.: US 10,633,759 B2
(45) Date of Patent: Apr. 28, 2020

(54) TECHNIQUE FOR CONTROLLING TEMPERATURE UNIFORMITY IN CRYSTAL GROWTH APPARATUS

(71) Applicant: GTAT Corporation, Merrimack, NH (US)

(72) Inventors: Frederick Schmid, Marblehead, MA (US); Cody Riopel, North Reading, MA (US); Hui Zhang, Nashua, NH (US)

(73) Assignee: GTAT Corporation, Hudson, NH (US)

( * ) Notice: Subject to any disclaimer, the term of this patent is extended or adjusted under 35 U.S.C. 154(b) by 618 days.

(21) Appl. No.: 14/488,513

(22) Filed: Sep. 17, 2014

(65) Prior Publication Data

US 2015/0090179 A1    Apr. 2, 2015

Related U.S. Application Data

(60) Provisional application No. 61/884,564, filed on Sep. 30, 2013.

(51) Int. Cl.
*C30B 11/00* (2006.01)
*C30B 29/06* (2006.01)
*C30B 29/20* (2006.01)

(52) U.S. Cl.
CPC .......... *C30B 11/002* (2013.01); *C30B 11/003* (2013.01); *C30B 29/06* (2013.01); *C30B 29/20* (2013.01); *Y10T 117/1092* (2015.01)

(58) Field of Classification Search
CPC ..... Y10T 117/1092; C30B 3/00; C30B 21/00; C30B 21/02; C30B 11/002; C30B 11/003; C30B 29/06; C30B 29/16; C30B 29/20
See application file for complete search history.

(56) References Cited

U.S. PATENT DOCUMENTS

| | | | |
|---|---|---|---|
| 3,898,051 A * | 8/1975 | Schmid | C30B 11/003 117/83 |
| 4,510,609 A * | 4/1985 | Caslavsky | C30B 11/003 373/110 |
| 6,254,677 B1 * | 7/2001 | Hashio | C30B 11/00 117/206 |

(Continued)

FOREIGN PATENT DOCUMENTS

| | | |
|---|---|---|
| KR | 10-2007-0118945 A | 12/2007 |
| KR | 10-2010-0024675 A | 3/2010 |

(Continued)

OTHER PUBLICATIONS

International Search Report dated Dec. 19, 2014 issued in connection with PCT/US2014/056080.

*Primary Examiner* — Hua Qi
(74) *Attorney, Agent, or Firm* — Behmke Innovation Group LLC; Jonathan P. Western

(57) ABSTRACT

A sapphire crystal growth apparatus is provided that includes a chamber, a hot zone and a muffle. More specifically, the hot zone is disposed within the chamber and includes at least one heating system, at least one heat removal system, and a crucible containing feedstock. Additionally, a muffle that surrounds at least two sides of the crucible is also provided to ensure uniform temperature distribution through the feedstock during crystal growth to allow the crystalline material to be grown with a square or rectangular shaped cross section.

14 Claims, 3 Drawing Sheets

(56) References Cited

U.S. PATENT DOCUMENTS

| | | | | |
|---|---|---|---|---|
| 6,299,682 B1* | 10/2001 | Wakita | ............... | C30B 11/003 117/11 |
| 6,712,904 B1* | 3/2004 | Sonnenberg | ......... | C30B 11/003 117/217 |
| 2007/0195852 A1* | 8/2007 | Clark | ............. | C30B 11/003 373/118 |
| 2010/0074825 A1* | 3/2010 | Kimbel | ............ | C30B 11/002 423/348 |
| 2011/0179992 A1* | 7/2011 | Schwerdtfeger, Jr. | ............. | C30B 11/003 117/81 |
| 2011/0259262 A1 | 10/2011 | Khattak et al. | | |

FOREIGN PATENT DOCUMENTS

| | | |
|---|---|---|
| KR | 10-2011-0127113 A | 11/2011 |
| KR | 10-2012-0029308 A | 3/2012 |

* cited by examiner

TECHNIQUE FOR CONTROLLING TEMPERATURE UNIFORMITY IN CRYSTAL GROWTH APPARATUS

CROSS-REFERENCE TO RELATED APPLICATION

The present application claims the benefit of U.S. patent application Ser. No. 61/884,564 filed Sep. 30, 2013, which is incorporated herein by reference.

BACKGROUND OF THE INVENTION

1. Field of the Invention

The present invention relates to a technique for controlling temperature uniformity in during and in a crystal growth apparatus by utilizing a muffle.

2. Description of the Related Art

Crystal growth apparatuses or furnaces, such as directional solidification systems (DSS) and heat exchanger method (HEM) furnaces, involve the melting and controlled resolidification of a feedstock material, such as alumina or silicon, in a crucible to produce an ingot. Production of a solidified ingot from molten feedstock occurs in several identifiable steps over many hours. For example, to produce an ingot, such as a sapphire ingot, by the HEM method, solid feedstock, such as alumina, is provided in a crucible containing a monocrystalline seed (which comprises the same material as the feedstock but with a single crystal orientation throughout) placed into the hot zone of a solidification furnace. A heat exchanger, such as a helium-cooled heat exchanger, is positioned in thermal communication with the crucible bottom and with the monocrystalline seed. The feedstock is then heated to form a liquid feedstock melt, without substantially melting the monocrystalline seed, and heat is then removed from the melted feedstock by applying a temperature gradient in the hot zone in order to directionally solidify the melt from the un-melted seed. By controlling how the melt solidifies, a crystalline material having a crystal orientation corresponding to that of the monocrystalline seed, and having greater purity than the starting feedstock material, can be achieved.

Crystal growth typically requires highly uniform and controllable temperature gradients in order to insure the proper crystallization and growth. As such crystals, such as sapphire, are often produced in a vacuum furnace. In a vacuum, heat transfer is carried out by radiation, which in a vacuum is not as efficient as convection in a gaseous atmosphere or conductive heat transfer because there are fewer atoms to transport heat.

Accordingly, radiational heat transfer in a vacuum furnace is heavily affected by the emissivity of the heating element and crucible and the distance from the heating element to the crucible. In a vacuum with less than 0.1 torr, heat transfer is not as sensitive to small changes in vacuum levels as it is above a 0.1 torr vacuum level. Therefore, the decreased heat transfer in vacuum below 0.1 torr or 100 microns eliminates the need to tightly control the vacuum level below 0.1 torr.

However, vacuum levels below 0.1 torr result in non-uniform heat transfer from the heating element to a crucible where the crystalline material is being produced. Since in a vacuum there is low heat transfer, the temperature near the middle of the crucible is higher than near the top and bottom of the crucible. As such, the higher temperature nearer the crucible center than near the bottom of the crucible causes the crystal to grow in a dome shape due to the higher crucible wall temperature near the center of the crucible than near the bottom of the crucible. The higher temperature near the center of the crucible as a result causes hemispherical growth near the top of the crystal due to the higher temperature in the middle of the crucible and lower temperature near the bottom of the crucible. This results in domed shaped crystals near the center of the crucible and reduces the amount of material that can be utilized in product manufacture. Thus, controlling the shape of the boule that is output in the vacuum is exceedingly difficult.

Growing crystals in a vacuum environment may also cause decomposition of the melt. For sapphire growth, for example, this causes the top of some boules to vaporize and decompose into sub-oxides and $O_2$ that are evacuated into the heat zone. Accordingly, the quantity of gases from the top surface of the melt depends on the diameter of the crucible, vapor pressure of the melt, vaporization of the crucible, and gaseous crucible melt interactions.

For example, experimental data has suggested that the light scatter in crystals increases as the crucible diameter increases since the surface area of the melt increases with the increase of the crucible diameter. Light scatter is understood by those skilled in the art as a measure of voids or inclusions in the crystal. In sapphire crystals, for example, there is almost no light scatter in eight-inch diameter sapphire crystals grown in vacuum. However, the light scatter does increase in sapphire crystals as the diameter of the melt surface is increased since the crystal's diameter increased. Light scatter in crystals is undesirable since it reduces the optical transmission particularly in ultraviolet (UV) light and above. Accordingly, the amount of light scatter is directly related to the crystal's diameter, and this reduces the amount of usable material from the crystal unless the diameter is properly controlled which is often dependent on temperature uniformity during crystal growth. One alternative to control temperature uniformity is helium. Helium is an excellent heat transfer gas used to achieve temperature uniformity by conductivity and convective heat transfer since helium gaseous materials are very small resulting in high convective heat transfer. However, the use of helium to achieve temperature uniformity has many disadvantages in the current systems. First, helium, a rare expensive gas, minimizes evaporation of impurities that decrease UV transmission, and causes a pink color throughout the crystal due to reactions with impurities that are not quickly flushed out of the hot zone as is the case for growth in vacuum. Also, growth in a helium atmosphere results in flat topped crystals, but with a pinkish color and lower ultraviolet impurities. Helium also requires more energy than vacuum growth. Thus, control under helium pressure is critical because changes in helium pressure affects heat loss, and therefore, pressure must be precisely controlled. Growth in a vacuum without helium thus preferred, however, there is currently no way to effectively control temperature uniformity and the shape of the boule in the vacuum without the use of such gaseous materials.

SUMMARY OF THE INVENTION

In an effort to solve the above problems with temperature uniformity in a crystal growth apparatus, the present invention provides a crystal growth apparatus that includes a chamber, a hot zone and a muffle, and a method for growing crystalline material therein. In particular, the present invention utilizes the muffle to control the transfer of heat from the hot zone and apply a uniform temperature to solid feedstock, e.g., solid alumina, in the crucible. In particular, in the exemplary embodiments of the present invention, the hot zone is disposed within the chamber and includes at least one heating system, at least one heat removal system, and a crucible containing solid feedstock. Additionally, the muffle surrounds at least two sides of the crucible to ensure uniform temperature distribution through the feedstock during crystal growth.

In some exemplary embodiments of the present invention, the muffle may also include a cover which has an exit port formed substantially in the center thereof. The cover may be disposed on an upper surface of the muffle and including a tube, a seat and preferably a protective barrier. In particular, the tube may extend through the muffle cover and then through a top cover of the furnace. Additionally, an insulating sleeve may surround the tube while a portion of the tube is passing through the top cover of the furnace. The tube may be configured to sit in a seat disposed in an opening in the muffle cover with the protective barrier formed between the seat and the tube.

Furthermore, the muffle and the crucible may have an inner cross section area that is formed in the shape of a square or rectangle so that the feedstock may be grown into a square or rectangular flat topped boule.

In another aspect of the present invention, method for producing a crystalline material is provided. In particular, the crystal growth apparatus includes a chamber and a hot zone within the chamber. The hot zone includes at least one heating system, at least one heat removal system, and a crucible containing at least solid feedstock. More specifically, a muffle is formed around the crucible in substantially the same shape of as the crucible control temperature uniformity during production of the crystalline material. The solid feedstock is then heated in the crucible with the heating system to form a liquid feedstock melt, and heat is uniformly applied by the heat zone to the feedstock from top to bottom through the muffle.

As such, the above described muffle allows for the crystalline material to be formed into a plurality of shapes by allowing the heat to be applied in a uniform manner through the solid feedstock material during heating of the feedstock material thus, allowing a more uniform product to be produced in a vacuum without the use of gaseous materials that contaminate the crystal.

DETAILED DESCRIPTION OF THE INVENTION

Figure 1:
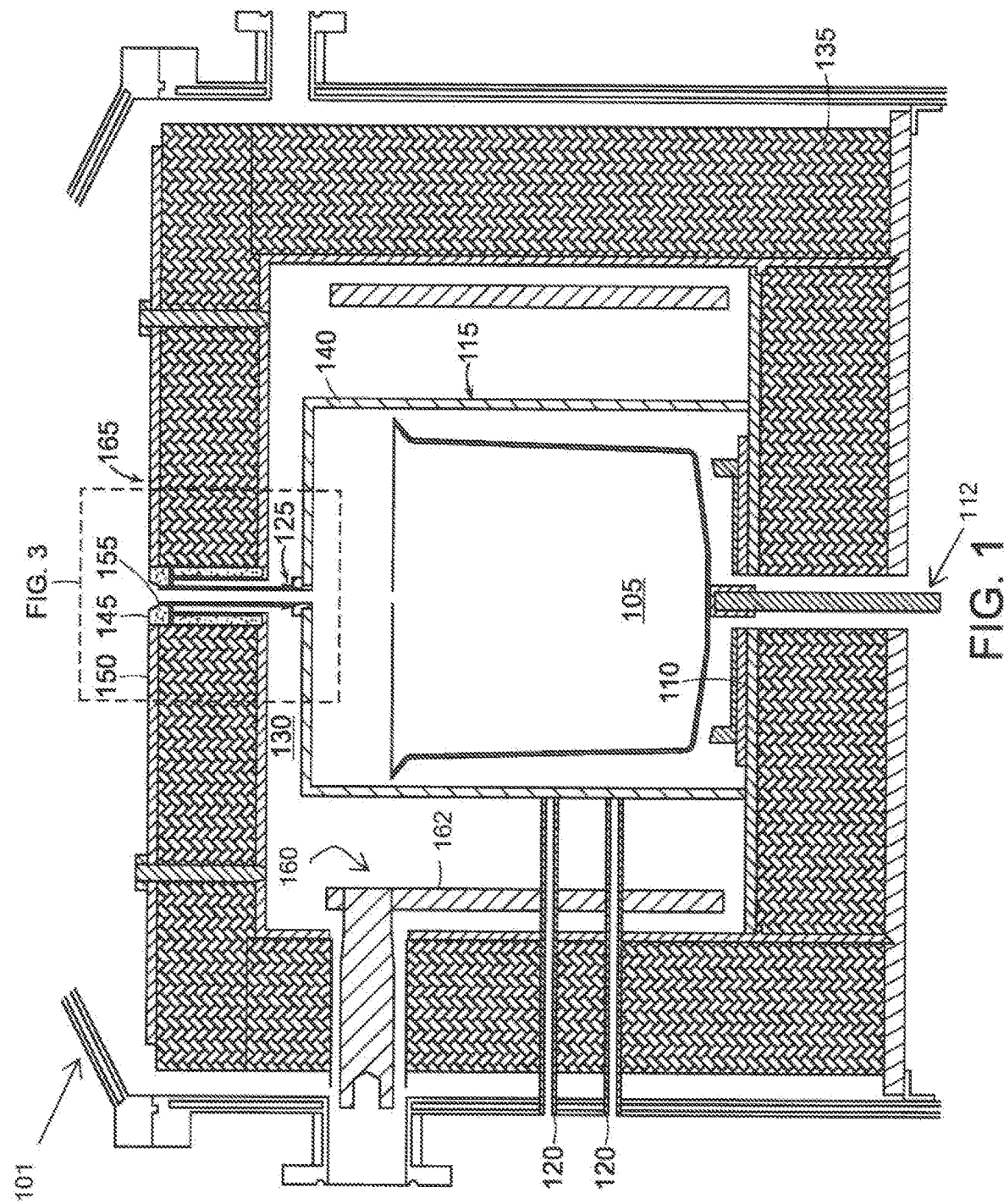
FIG. 1 shows an exemplary view of a sapphire crystal growth apparatus according to an exemplary embodiment of the present invention.

The present invention relates to a technique for controlling temperature uniformity in a crystal growth apparatus during crystalline production through the use of a muffle.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

As stated above, for a crystal growth apparatus to function properly, it is important to have a uniform temperature from the bottom to top of the crucible to grow flat crystals. As such the present invention utilizes a muffle to control the uniformity of the temperature in the crystal growth apparatus during crystalline material production. When the muffle is not used the temperature near the bottom of the crucible is lower than in the middle or top of the heat zone which causes crystalline material or boule to be deformed.

For conventional HEM and/or other bottom growth processes with a uniform thickness heating element, the bottom temperature will be lower than the mid height of the crucible. Crystalline material will grow close to an outer edge of the crucible as heat is extracted from the bottom of the crucible. As the crystal grows taller, the crucible wall temperature is higher than in the center radius causing faster growth in the center section than a hotter outer wall temperature near the mid portion of the crucible. This condition is exacerbated as the crystal height increases causing a dome shaped crystal. Dome crystals result in less usable material than for a flat topped crystal. It is, however, important to have a uniform temperature across and from the bottom to the top of the crucible in order to grow large diameter crystals with a flat top.

Accordingly, a muffle has been provided in the crystal growth apparatus of present invention to allow for uniform temperature application in a vacuum atmosphere without the use of helium as a temperature control agent. In particular, the muffle is preferably made of a high conductivity (e.g., the same material as the heating element of the crystal growth apparatus). The muffle may be either an open-ended cylinder or a three sided cylinder with a cover, that is positioned between a crucible and a heating element within the crystal growth apparatus for improved heat flow (i.e., temperature uniformity) from the heating element to the crucible in a vacuum environment.

As mentioned above, the muffle may be made out of the same material as the heat zone, since such a material would preferably have high conductivity. As such, the muffle is positioned between the heating element and the crucible to achieve a uniform temperature around the crucible and from the bottom to the top of the crucible.

FIG. 1 shows an exemplary view of a crystal growth apparatus according to an exemplary embodiment of the present invention. Referring to FIG. 1, a crystal growth apparatus 100 is provided which includes an outer container 101, a chamber 130 and a hot zone which may be utilized in the production of a crystalline material such as sapphire or silicon such as monocrystalline silicon. This crystal growth apparatus in the exemplary embodiment of the present invention may be embodied as a directional solidification furnace, however, those skilled in the art will understand than present invention may be applied to any crystalline production furnace without departing from the overall object of the present invention.

The chamber 130 may be enclosed by an outer shell of insulation 135 and a top insulation cover 150. The outer shell 135 may include insulation that controls the temperature within the hot zone accordingly. The hot zone itself may be made up of at least one heating system 160, at least one heat removal system 110, a muffle 115 and a crucible 105 which contains the feedstock material, e.g., solid alumina in the case of sapphire production. The at least one heating system 160 includes a heating element 162. The heat removal system 110 for the above described crystal growth apparatus may be preferably a heat exchanger 112 positioned beneath the crucible to remove heat from the system accordingly.

As can be seen from FIG. 1, the muffle 115 may be disposed between the heating system 160 and the crucible 105. Preferably the muffle is positioned closer to the crucible than the heating system in order to achieve high temperature uniformity from the bottom to the top of the crucible. By placing the muffle 115 between the heating system 160 and the crucible 105, the heat applied by the crucible 105 is more evenly or uniformly applied to the solid feedstock in the vacuum. In the vacuum, the wall thickness of the muffle affects temperature gradients from the bottom to top of the crucible. A thin-walled muffle will result in a lower temperature on the bottom of the heat zone, and a thicker-walled muffle will result in a more uniform temperature from the bottom to the top of the crucible. As such, the thickness of the muffle walls may be adjusted to achieve the proper gradient from the bottom to top of the crucible. Furthermore, the inside of the muffle may be adapted to react with decomposed products within the heat zone to form a protective layer that prevents further reactions so that vapors from the crucible are drawn out by the vacuum system through, e.g., an exit port 125 discussed further below. For example, in some embodiments the walls of the muffle may have a tapered thickness to control the temperature distribution throughout the muffle even more precisely.

Figure 2:
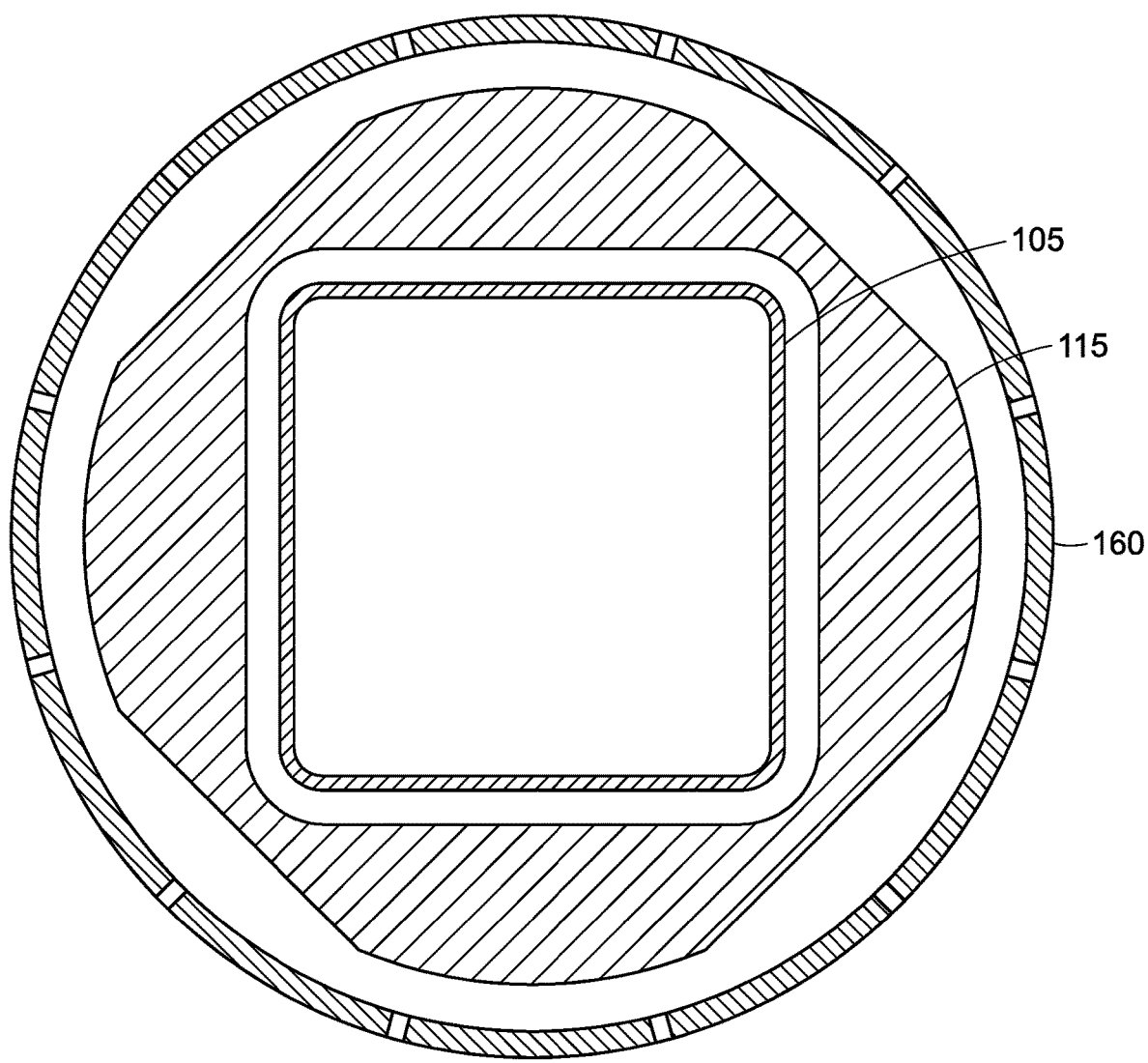
FIG. 2 shows a cross sectional view from above of the heating system, muffle and crucible according to the exemplary embodiment of the present invention.

The muffle 115 in the exemplary embodiment of the present invention may be a cylindrical like structure disposed between the crucible 105 and heating system 160 that sits on top of the heat removal system 110. As stated above, the muffle 115 makes it possible to reproducibly grow large-diameter high-quality flat crystals in a plurality of cross sectional shapes in a vacuum due to the temperature uniformity that is applied by the muffle. For instance, the muffle 115 may be formed so as to have a square or rectangle shaped cross section on an inner surface. As can be seen in FIG. 2, the muffle 115 and crucible 105 may have a substantially squared cross section on its inner surface while the heating system 160 may have a rounded cross section shape. This substantially squared cross section allows the crystalline material to be formed in a rectangle having a squared cross section rather than a cylindrical shape like in convention crystalline material production due to the uniform temperature distribution that is provided by the muffle 115.

In particular, shaped crystals can be grown by tailoring the shape of the muffle 115 to grow shaped crystals in a cylindrical heat zone. Heat transfer by conduction is more efficient than by radiational heat transfer in a vacuum environment as discussed above. However, the muffle can be shaped to control heat transfer for non-cylindrical growth, for example, growth of a square or rectangular shaped crystal as mentioned above. With the shaped muffle, the area closer to the heating element would be hotter than an area further away from the heater. The side section of the muffle can be reduced in thickness, as shown in FIG. 2, reducing the heat transfer to the crucible corners 106 to achieve uniform temperature around the circumference of square or rectangular shaped crucibles (i.e., the muffle is thicker in each of its corners 116 than along sides 117 of the muffle). As FIG. 2 shows, the muffle can be oriented such that at least one of the corners 116 of the muffle is positioned between a center of one side 107 of the crucible and the heating element. As such, radiational heat transfer can be tailored to grow square, rectangular or other shaped crystals in a round heat zone. The heat transfer for the corners of square shaped crystals can also be tailored by using insulation to lower heat transfer to the corner of the square shaped crucible. Alternatively, the side section of the muffle can be increased in thickness to create a bulbous shape which can provide other beneficial effects.

Besides equilibrating temperature from the bottom to the top of the crucible, the muffle tube can isolate the melt in the crucible from the heat zone by covering the top of the muffle 115 with a muffle cover 140 with an exit port 125 through the top insulation cover 150 for evacuation by, e.g., a vacuum pump. When a muffle cover 140 and an exit port 125 are provided, gaseous contaminants can be flushed out of the muffle to prevent reaction with the heat zone. In this case, the evaporation of decomposition vapors from the melt, such as AlO, $Al_2O$ and O, are evacuated out of the heat zone to prevent further reaction with therein. As such, evacuation of the effluents out of the heat zone eliminates reactions that generate more reactions with the heat zone thus degrading the heat zone. If the reaction continues and produces more effluents that react with the melted feedstock, the electrodes and electrode ports may become clogged. These reactions cause life reduction and degradation of the electrodes and electrode ports. Thus, if a muffle cover is not used, buildup of conductive contaminants formed between the electrode and its ports must be removed after each run to prevent arcing to the insulation 135. As such, degradation of the heat zone is eliminated by channeling the gaseous decomposition products trapped inside the muffle out through the exit port 125. Accordingly, degradation of the heat zone is prevented by channeling the effluents directly out of the heat zone.

Figure 3:
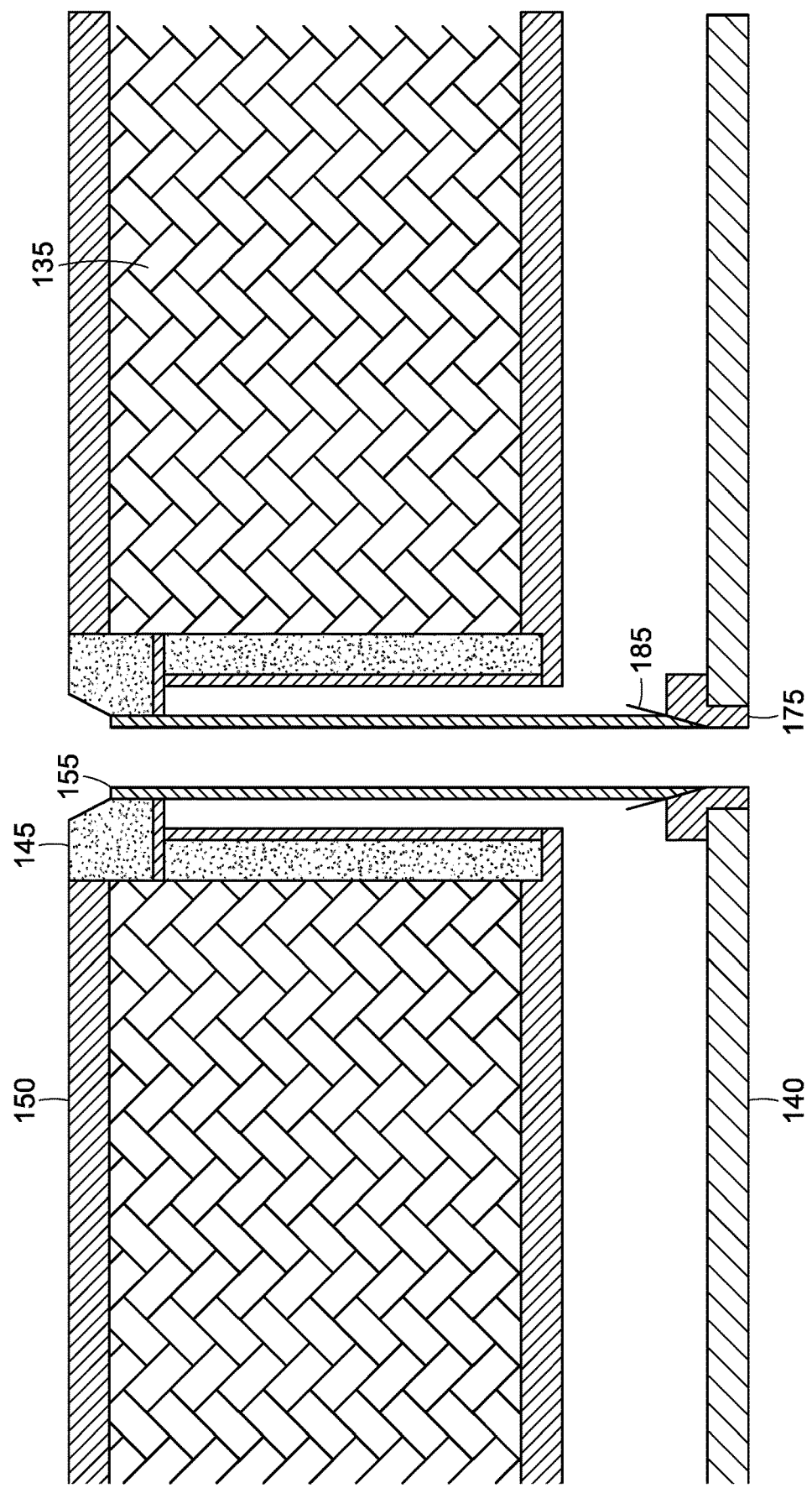
FIG. 3 shows an exploded view of section 165 in FIG. 1 according to the exemplary embodiment of the present invention.

FIG. 3 shows an exploded view of section 165 in FIG. 1 illustrating the muffle cover 140 and exit port 125 according to the exemplary embodiment of the present invention. In FIG. 2, the muffle cover 140 may be fitted with a tube 155 which is inserted into seat 175 disposed in an opening of the muffle cover 140. Preferably, tube 155 is fitted tightly in the muffle cover 140 to prevent leakage. Between the seat 175 and the tube 155 may also be a protective barrier 185. The tube 155 may extend through the top insulation cover 150 so as to emit contaminants within the muffle to the atmosphere. Also, a sleeve 145 may be formed around a portion of the tube which is passing through the insulation cover. Thus, by utilizing the exit port 125, reactions with the heat zone may be eliminated, thereby eliminating its degradation after each run and the need to dismantle the furnace to clean the electrode ports after each run. Accordingly, in some exemplary embodiments, the muffle cover 140 with an exit port may be utilized to effectively channel all effluents through the exit port 125 and out of the heat zone.

In addition, the exit port 125 may in some embodiments be made out of the same material as the heat zone, e.g., molybdenum or tungsten, to aide in preventing the tube form being clogged. If during a run cycle the tube 155 plugs, the effluents cannot escape to the hot zone as the hot zone or other high conductivity material will not react with the effluents and thus the crystal being grown becomes contaminated. A molybdenum or tungsten tube was designed to remain open during the entire run to remove all effluents from the crucible out of the heat zone. Accordingly, the exit 125 may not extend into the hot zone thus preventing decomposition products from depositing on the tube and plugging it, thereby preventing decomposition vapor from being drawn out of the chamber by the vacuum system.

Additionally, one or more ports 120 may also be installed on at least one side surface of the muffle 115. The ports 120 may extend from the outer surface of the side surface, through the outer shell and insulation 135 and into an external atmosphere. These ports 120 may be used to eliminate reactants on the muffle that may be formed during a run cycle to prevent the reactants from contaminating the crystalline material in the crucible 105.

Another aspect of the present invention includes a method of producing a crystalline material. In particular, the crystal growth apparatus (including the muffle) discussed above is provided. The solid feedstock in the crucible is then heated through the muffle with the heating system to form a liquid feedstock melt. Heat from the heat zone is uniformly applied to the feedstock from top to bottom and cooled to form the feedstock into boule having a shape that is substantially similar to an inner surface of the crucible and muffle.

Additionally, in some embodiments of the present invention, a helium or Argon atmosphere may be to aide in temperature uniformity and to suppress evaporation. Helium and Argon have increased heat transfer characteristics that will additionally aid in temperature uniformity when used along with the above described muffle from top to bottom of the furnace heat zone making it possible to grow flat crystals.

Likewise, as another means for further enhancing and controlling the thermal uniformity in the crystalline material through the use of a muffle, the muffle may be used to tailor a specific thermal profile of the crystalline material in an axial direction of the crystalline material during the growth process. In doing so, the crucible may be selectively shielded from radiation around its center while at the same time allowing radiation to reach the crucible at the top and bottom. This technique allows the temperature of the top and bottom of the feedstock material to be decoupled from the center through the use of the muffle as well. As a result this would allow for even further control of the temperature throughout the growth process, and thus, providing further beneficial control features to the above muffle embodiment.

Accordingly, the Applicant's claimed invention utilizes a muffle in in-between the crucible and the heating system to achieve temperature uniformity from the bottom to the top of the heat zone. Besides improving heat flow conditions for crystal growth, an exit port in the muffle also advantageously emits effluents out of the heat zone, thus isolating the furnace chamber from the vapors that are rejected from the melt. As such, a cover with port to outside the heat zone can flush reactive vapors that would react with the heat zone out of the heat zone with the vacuum system. Accordingly, reactions between the chamber and effluents from the melt are evacuated out of the heat zone by the vacuum system. This eliminates the reactions between the heat zone and effluents that would generate more gases and erosion of the element, heat zone and electrodes.

Advantageously, the muffle, therefore, improves the temperature uniformity from the bottom to the top of the crucible, and channels the gaseous reactions out of the heat zone. Degradation of the heat zone is eliminated as a result of gaseous reaction. The muffle, therefore, allows for growth of flat crystals with lower gas content and eliminates erosion of the heat zone, which requires repair after each run. By eliminating degradation of the heat zone, the crystal growth process is much more reproducible for improved productivity. Additionally, the muffle also allows for alternatively shaped crystalline material to be grown where previous growth apparatus we limited to a cylindrical shape.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

The invention claimed is:

1. A crystal growth apparatus comprising:
an outer container;
a chamber formed by an outer shell of insulation and a top insulation cover, wherein the chamber is formed within the outer container;
a hot zone within the chamber, the hot zone including a crucible, a heating element disposed between the crucible and the outer shell of insulation, and a heat exchanger positioned beneath the crucible, wherein the crucible has a square or rectangular cross section, and the heating element has a circular cross section; and
a muffle disposed within the hot zone and configured to apply heat uniformly to the crucible, the muffle surrounding at least two sides of the crucible and disposed between the heating element and the at least two sides of the crucible, wherein the muffle has a square or rectangular cross section, the muffle is thicker in each of a plurality of corners thereof than in each of a plurality of sides thereof, and the muffle is oriented such that at least one corner of the plurality of corners of the muffle is positioned between a center of one side of the crucible and the heating element.

2. The crystal growth apparatus of claim 1, wherein the muffle includes a muffle cover disposed on a top side of the muffle.

3. The crystal growth apparatus of claim 2, wherein an exit port is formed in the muffle cover which includes a tube that is inserted in a seat disposed in the muffle cover, the tube extending from the seat to an outer surface of the chamber.

4. The crystal growth apparatus of claim 3, wherein a protective barrier is disposed between the seat and the tube.

5. The crystal growth apparatus of claim 3, wherein the tube is made of molybdenum or tungsten.

6. The crystal growth apparatus of claim 2, wherein the muffle cover includes an exit port and is fitted with a tube inserted into a seat disposed in an opening in the muffle cover.

7. The crystal growth apparatus of claim 6, wherein the tube extends through the top insulation cover.

8. The crystal growth apparatus of claim 7, wherein a sleeve is formed around a portion of the tube that passes through the top insulation cover.

9. The crystal growth apparatus of claim 7, wherein the exit port is inside of the outer container.

10. The crystal growth apparatus of claim 1, wherein the muffle is formed with walls having a tapered thickness.

11. The crystal growth apparatus of claim 1, wherein the crystal growth apparatus is a sapphire crystal growth apparatus.

12. The crystal growth apparatus of claim 1, wherein the muffle is positioned closer to the crucible than the heating element.

13. The crystal growth apparatus of claim 1, wherein the muffle and the crucible form a flat topped boule with a square or rectangular shaped cross section, respectively.

14. The crystal growth apparatus of claim 1, wherein a vacuum environment is formed within the heat zone.

* * * * *